United States Patent [19]

Rock, Jr.

[11] 4,281,415
[45] Jul. 28, 1981

[54] DIGITAL TUNER

[75] Inventor: Joseph Rock, Jr., Frederick, Md.

[73] Assignee: Norlin Industries, Inc., Deerfield, Ill.

[21] Appl. No.: 78,493

[22] Filed: Sep. 24, 1979

[51] Int. Cl.³ .............................................. H04B 1/40
[52] U.S. Cl. .................................... 455/173; 455/182; 455/183
[58] Field of Search ............... 455/182, 183, 184, 179, 455/192, 195, 196, 170, 173; 334/14, 15, 16

[56] References Cited

U.S. PATENT DOCUMENTS

| | | | |
|---|---|---|---|
| 3,806,818 | 4/1974 | Uchiyama | 455/173 |
| 3,835,384 | 9/1974 | Liff | 455/182 |
| 3,949,305 | 4/1976 | McClaskey | 455/183 |
| 4,097,810 | 6/1978 | Achwanden | 455/183 |
| 4,123,716 | 10/1978 | Borg | 455/195 |
| 4,127,822 | 11/1978 | Mogi | 455/182 |

FOREIGN PATENT DOCUMENTS 2333044  1/1975  Fed. Rep. of Germany ........... 455/173

Primary Examiner—Marc E. Bookbinder
Assistant Examiner—Tommy P. Chin
Attorney, Agent, or Firm—Jack Kail; Ronald J. Kransdorf

[57] ABSTRACT

A variable rate tuner is one in which the rate of change of tuned frequency with respect to tuning shaft rotation varies automatically as a function of the shaft rotation speed. In this tuner the circuitry is completely digital, including a shaft encoder which puts out shaft velocity and shaft direction signals. A digital multiplier multiplies or divides the shaft velocity signal. A counter selects the multiplication factor as a function of shaft velocity. The multiplied velocity signal then increments or decrements a frequency-determining quantity, depending upon whether the shaft direction is such as to increase or decrease the tuned frequency.

10 Claims, 1 Drawing Figure

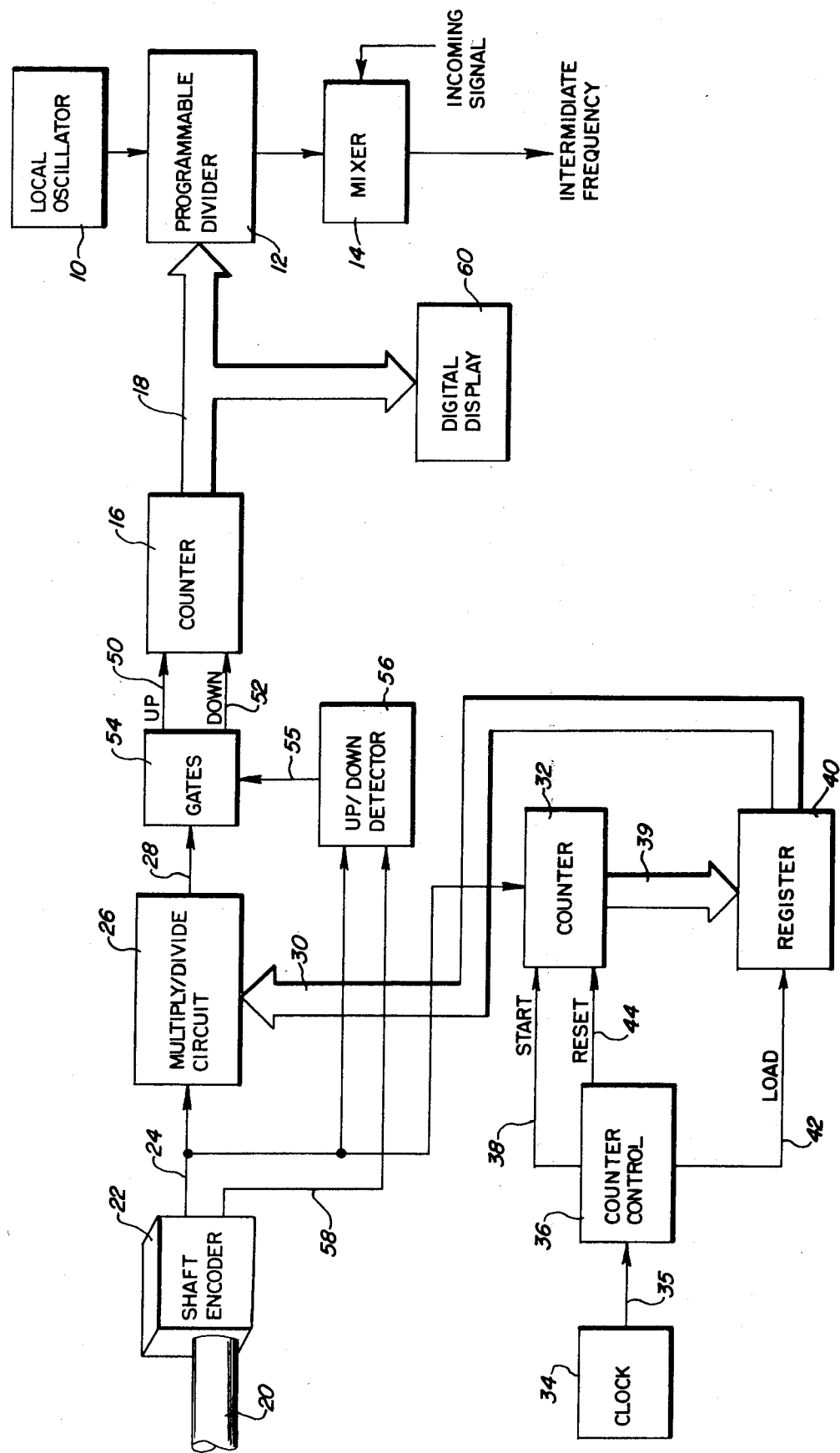

DIGITAL TUNER

BACKGROUND OF THE INVENTION

This invention relates generally to tuning controls for communications transmitters or receivers. It particularly concerns variable rate tuning controls, i.e. those which offer a choice of either a larger or a smaller degree of change in the tuned frequency for a given rotation of the tuning control knob.

Fine tuning of communications equipment can be more easily and accurately accomplished if the tuned frequency changes slowly during a large rotation of the control knob. But such a slow rate of change becomes tedious and time consuming when large frequency changes are required; this is because many revolutions of the tuning knob are then required. The prior art has therefore developed several types of variable rate tuners, which offer a choise of tuning speeds relative to knob rotation: slower for fine tuning, and faster for large frequency changes.

One type of variable rate tuner known to the prior art provides a special manual switch for selecting the tuning speed. This approach is effective, but is also somewhat inconvenient because it requires the manipulation of two separate control devices: the speed selector switch and the tuning knob.

To provide greater convenience for the operator, the prior art has provided other variable rate turning circuits in which the rate of change of frequency with respect to a given degree of tuning knob rotation changes automatically according to the speed at which the tuning knob is turned. When the knob is turned slowly, a relatively small frequency change occurs for a given number of revolutions. But when the knob is turned rapidly, a relatively large frequency change occurs for the same number of revolutions. Special analog circuitry is provided for detecting the rotation speed of the tuning knob, and for changing the tuning rate as a function thereof. Because this circuitry is analog in nature, it tends to be sensitive to temperature and to component variations resulting from aging and other causes. It also presents problems of circuit alignment, is relatively expensive, and consumes a significant amount of power.

BRIEF SUMMARY OF THE INVENTION

This invention provides an automatic variable rate tuning control circuit which differs from those of the prior art in that exclusively digital circuitry is used for detecting the rotational speed of the tuning knob, and for changing the tuning rate accordingly. This use of digital rather than analog circuitry avoids the problems of component sensitivity and circuit alignment. It also reduces cost and power consumption.

The digital variable rate tuner drive circuit of this invention includes a manually movable tuning control member, such as a shaft connected to the tuning knob, and a circuit which responds to the motion of that member to provide one or more signals. These signals digitally indicate the velocity of the motion of the control member (e.g. tuning shaft rotation speed), and the direction of motion of the control member (e.g. whether the tuning shaft is rotating clockwise or counterclockwise). There is also an incrementable and decrementable digital counter for storing a quantity which determines the tuner frequency, and a digitally programmable multiplication circuit. The multiplication circuit receives the control member velocity signal and digitally multiplies the indicated velocity value by a selected factor. It also produces an output which is available for digitally incrementing or decrementing the quantity stored in the digital counter, thus raising or lowering the tuned frequency. There are means responsive to the control member direction signal (e.g. the clockwise counterclockwise indication) to cause the multiplication circuit output to increment the counter quantity when the tuning control member is moved in one direction (e.g. when the tuning shaft is rotated in the direction to increase the tuned frequency). Conversely, it decrements the counter quantity when the tuning control member is moved in the opposite direction (e.g when the tuning shaft is rotated in the direction to decrease the tuned frequency). Finally, there are means responsive to the control member velocity signal to program the multiplication circuit to select a multiplication factor which is proportional to the control member velocity (e.g. to tuning shaft rotation speed). Thus the rate of change of tuner frequency with respect to control member displacement is a function of control member velocity (in the example given, the amount of frequency change per tuning shaft revolution is a function of tuning shaft rotation speed). Consequently, automatic variation of tuning rate is achieved digitally, without the undesirable characteristics of prior art analog circuits.

The invention thus briefly summarized will now be described in detail in connection with a particular preferred embodiment which is illustrated in the following drawing.

BRIEF DESCRIPTION OF THE DRAWING

The single FIGURE of the drawing is a functional block diagram of a variable rate digital tuner drive circuit in accordance with this invention.

DETAILED DESCRIPTION OF THE PREFERRED EMBODIMENT

The invention is assumed to be used with a radio receiver of the conventional superheterodyne type, which operates at a fixed intermediate frequency and is tuned by varying a local oscillator frequency beating against the incoming signal frequency. The intermediate frequency signal is generated in the following way: a local oscillator 10 provides a fixed high frequency output, which is divided down to a lower frequency level by a programmable divider 12 for providing one input to a mixer 14. The second input of the mixer 14 is supplied with the incoming signal frequency which is beat with the divided local oscillator signal to produce the intermediate frequency signal. The signal frequency to which the receiver is tuned therefore depends upon the divided local oscillator frequency which, in turn, depends on the value to which the divider 12 is programmed.

The division ratio employed by the programmable divider 12 is controlled by a digital word stored in a pulse counter 16 and outputted to the programmable divider 12 over a cable 18. Thus, the tuned frequency of the receiver is raised or lowered by increasing or decreasing the numerical value of the digital word stored in counter 16; i.e. by incrementing or decrementing the counter. The rate at which any such change in tuned frequency occurs depends on the repetition rate at which incrementing or decrementing pulses are delivered to counter 16. We shall now consider, in turn, how the circuit of this invention accomplishes these two objectives: driving the counter 16 at the proper rate, and driving it in the proper numerical direction (up or down).

Let us first consider the rate aspect. The manually operated tuning control member is usually in the form of a rotatable tuning knob which turns a tuning shaft 20. Rotation of the shaft 20 is sensed by a shaft encoder 22. The latter is in effect a pulse generator which generates one pulse for every increment of shaft rotation of a predetermined size, for example, one pulse for every few degrees of shaft rotation. Thus the rate at which such pulses are generated per unit time by encoder 22 is a measure of the speed of rotation of the tuning shaft 20.

The resulting output pulse train from encoder 22 appears on a line 24, and is thus delivered to the input of a multiplier circuit 26 which then produces an output pulse train on line 28. The operating characteristic of multiplier 26 is such that the repetition rate of the output pulse train on line 28 is a selected multiple of the repetition rate of the input pulse train on line 24. In order to select the rate multiplication factor, the circuit 26 is programmable in response to a digital word arriving over a cable 30. Preferably the value of the rate multiplication factor is variable from fractional values (between zero and one) at the low end of the range of integral values (greater than one) at the high end. When the rate multiplication factor is less than one, the circuit 26 actually operates as a divider. When the factor exceeds one, then the circuit operates as a multiplier in the narrow sense. Henceforth, in this specification, and in the appended claims as well, the term "multiplier" shall be used in the broader sense, which includes division whenever the so-called multiplication factor is a fraction.

We shall next consider how the digital word on cable 30 is chosen so that it selects the appropriate multiplication factor for the circuit 26. The shaft encoder pulse train on line 24 is delivered to the input of a pulse counter 32. A clock source 34 provides a time reference signal to a control circuit 36 which cycles the counter 32 through repeated count intervals of equal duration. At the beginning of each count interval the control circuit 36 starts the counter 32 by issuing a "start" command on a line 38. At the end of each count interval the control circuit 36 causes the accumulated count in the counter 32 to be loaded (via a cable 39) into a storage register 40; the control circuit accomplishes this by issuing a "load" command over a line 42. After the load operation has been accomplished, and before the start of the next count interval, the control circuit 36 causes the counter 32 to be reset to zero by issuing a command on a line 44. This clears the counter 32 for the start of the next count interval.

Since the counter intervals are all of equal duration, the numerical value of the count accumulated in the counter 32 during any such interval is a function of the repetition rate of the shaft encoder pulses arriving over line 24 which, in turn, is a function of the average rotation speed of the tuning shaft 20 during the count interval. Thus the numerical value accumulated in the counter 32 and loaded into the register 40 at the conclusion of each count interval is a measure of the tuning shaft speed; and it is this numerical value which is outputted over cable 30 by the register 40, causing the multiply/divide circuit 26 to select a multiplication factor which is a function of the tuning shaft rotation speed.

Consequently, when the tuning shaft 20 is turned slowly, in an attempt to fine-tune the radio receiver frequency, the pulse repetition rate on line 28 is reduced (by fractional multiplication). As a result, the pulse train on line 28 is only capable of changing the numerical content of counter 16 relatively slowly, more slowly than even the slow tuning shaft rotation would otherwise warrant. Conversely, when the tuning shaft 20 is turned rapidly, to achieve a large frequency excursion in a short time, multiplication by a value greater than one causes the pulse repetition rate on line 28 to be greater than the shaft rotation speed would warrant. Such a pulse train is capable of changing the numerical content of counter 16 rapidly.

Next we turn our attention to the question of the direction of change: i.e. the question of whether the numerical content of the counter 16 is incremented, to indicate a change in the tuned frequency in one direction; or decremented, to indicate a change in the tuned frequency in the opposite direction. The counter 16 has two input lines: the "up" line 50, which is connected to an incrementing input of the counter 16; and the "down" line 52 which is connected to a decrementing input thereof. The multiplied pulses on line 28 which increment or decrement the counter 16 are controlled by a gating circuit 54 which must steer the pulses to "up" line 50 when the tuning shaft 20 is turned one direction, and to "down" line 52 when the tuning shaft 20 is turned in the opposite direction.

The up or down condition of the gating circuit 54 is controlled by the presence or absence of a command signal supplied on a line 55 by a circuit 56 which is designed to detect the direction in which tuning shaft 20 is turning. The shaft encoder 22 has a second output line 58; and on this line the encoder produces a second stream of pulses in response to the rotation of the tuning shaft 20. The pulse train on line 58 is similar to that which appears on the other encoder output line 24, but is in quadrature relation therewith: i.e. each pulse on line 58 is phased 90° ahead of or behind its corresponding pulse on line 24, with respect to a cycle of rotation of the tuning shaft 20. The phase relationship is lagging when the shaft 20 is turning in one angular direction, and leading when the shaft is turning in the opposite angular direction. The up/down detector circuit 56 is in effect a phase sign detector, recognizing that a leading phase relationship indicates that the tuned frequency is to be changed in one direction, while a lagging phase relationship indicates that the tuned frequency is to be changed in the opposite direction. Then the up/down detector circuit 56 delivers the appropriate gate control command on line 55 to determine whether the multiplied pulses on line 28 are applied over line 50 to increment, or over line 52 to decrement, the counter 16 which controls the programmable divider 12 and thereby the tuned frequency.

To provide a continuous indication of the tuned frequency, the numerical content of the counter 16 is applied over cable 18 to a digital display circuit 60, which includes appropriate decoding circuitry to convert the numerical content of the counter into a direct digital read-out of the tuned frequency. As the content of counter 16 is changed either up or down during tuning, the digital read-out changes with it.

One of the practical advantages of this invention resides in the fact that it can be realized using only standard integrated circuits which are readily available from commercial sources. In a particular embodiment which was actually reduced to practice, the following off-the-shelf chips were employed:

| FUNCTIONAL BLOCK | COMMERCIAL CHIP |
|---|---|
| Counter 16 | Texas Instruments SN 74LS192 (one or more, depending on resolution desired) |
| Shaft Encoder 22 | Disc Instruments 822-500-OALP-TTL |
| Up/Down Detector 56 | Motorola MC14013, MC14528, MC14071, MC14081 |
| Multiply/Divide Circuit 26 | Motorola MC14028, MC14002, (2) MC14071, (2) MC14081 |
| Counter 32 | Motorola MC14518 |
| Counter Control 36 | Motorola MC14518, MC14028 |
| Register 40 | Motorola MC14042 |
| Clock 34 | Motorola MC14011, MC14017, (2) MC14518; Signetics 8292A |
| Gates 54 | Motorola MC14081; Texas Instruments SN 74LS04 |

A wide variety of other standard IC's can also be used in place of those specified above.

It will be appreciated that all of the circuitry described is digital in nature. That is to say, all the circuits merely generate, detect, or gate pulses. All operations depend either upon the binary presence or absence of such pulses, or upon their repetition rate. No voltage or current levels have analog data significance in this circuit. Accordingly, the sensitivities, component variations, alignment problems, cost and power consumption problems associated with analog circuits are not problems here. It follows that the present invention provides an all-digital and therefore more economical and trouble-free approach to the design of an automatic variable rate tuner circuit.

The embodiment described above is merely one specific example of the digital design approach of this invention, albeit the one which is presently preferred. Other specific embodiments are possible, yet will still fall within the scope of this invention, as it is defined in the appended claims.

I claim:

1. A digital variable rate tuner drive circuit comprising:
tuning control means, means responsive thereto for providing a rate signal and a direction signal digitally indicating the rate of activity of said control means and the direction of effectiveness of said control means respectively, an incrementable and decrementable digital counter for storing a quantity which determines the frequency of a tuner, a digitally programmable multiplication circuit receiving said rate signal and digitally multiplying said rate signal by a selected factor, means for applying the output of said multiplication circuit for digitally incrementing or decrementing the quantity stored in said digital counter whereby to raise or lower the tuner frequency, means responsive to said direction signal and arranged to cause said multiplication circuit output to increment said counter quantity when said tuning control means is effective in one direction and to decrement said counter quantity when said tuning control means is effective in the opposite direction, and means responsive to said rate signal to program said multiplication circuit to select a multiplication factor which is proportional to said rate signal, whereby the rate of change of tuner frequency is a function of the rate of activity of said control means.

2. A digital variable rate tuner drive circuit comprising:
a movable tuning control member, means responsive to said member to provide a velocity signal and a direction signal digitally indicating the velocity of the motion of said control member and the direction of motion of said control member respectively, an incrementable and decrementable digital counter for storing a quantity which determines the frequency of a tuner, a digitally programmable multiplication circuit receiving said velocity signal and digitally multiplying said velocity signal by a selected factor, means for applying the output of said multiplication circuit for digitally incrementing or decrementing the quantity stored in said digital counter whereby to raise or lower the tuner frequency, means responsive to said direction signal and arranged to cause said multiplication circuit output to increment said counter quantity when said tuning control member is moved in one direction and to decrement said counter quantity when said tuning control member is moved in the opposite direction, and means responsive to said velocity signal to program said multiplication circuit to select a multiplication factor which is proportional to said velocity signal, whereby the rate of change of tuner frequency is a function of the rate of displacement of said control member.

3. A circuit as in claim 2 wherein the values of said multiplication factor extend into the fractional range between zero and one when the velocity of said tuning control member is relatively low, and into the range greater than one when said velocity is relatively high.

4. A circuit as in claim 2 further comprising a digital display arranged to read out the numerical content of said counter whereby to provide a running indication of the tuner frequency.

5. A circuit as in claim 2 wherein:
said means responsive to said tuning control member comprises a pulse generator means, said velocity signal is a pulse train provided by said pulse generator means at a repetition rate proportional to the control member velocity, said multiplication circuit receives said pulse train and produces an output pulse train at a repetition rate equal to said pulse repetition rate multiplied by said selected factor, and said multiplied repetition rate output pulse train is used to increment or decrement said digital counter quantity.

6. A circuit as in claim 5 wherein said means which programs said multiplication circuit comprises:
a second counter for counting the pulses in said velocity signal, and means responsive to the count accumulated in said second counter during a predetermined time interval to program said multiplication circuit to select a multiplication factor which is proportional to said accumulated count, whereby said multiplication factor is proportional to the rate of displacement of said control member.

7. A circuit as in claim 6 wherein said means which programs said multiplication circuit further comprises:
means for defining said predetermined time interval and for resetting said second counter to zero at or prior to the beginning of said interval and for starting the count of said second counter at the beginning of said interval and stopping the count of said second counter at the end of said interval, a storage register, and means for loading into said register the count accumulated in said second counter at the end of said interval, said multiplication circuit being responsive to the quantity stored in said register to select the multiplication factor employed by said multiplication circuit.

8. A digital variable rate tuner drive circuit comprising:

a tuning control shaft;

a shaft encoder responsive thereto to provide a pulse train signal the repetition rate of which is proportional to the angular velocity of said shaft and a second stream of pulses digitally indicating the angular direction of said shaft, an incrementable and decrementable pulse counter for storing a quantity which determines a tuner frequency;

a digitally programmable multiplication circuit receiving said shaft encoder pulse train and multiplying the repetition rate thereof by a selected factor to produce a multiplied repetition rate output pulse train which is available for incrementing or decrementing the quantity stored in said pulse counter whereby to raise or lower the tuner frequency;

means responsive to said shaft angular direction stream of pulses and arranged to cause said multiplied repetition rate pulse train to increment said pulse counter quantity when said tuning control shaft is turned in one angular direction and to decrement said pulse counter quantity when said tuning control shaft is turned in the opposite angular direction; and means responsive to said shaft encoder pulse train repetition rate to program said multiplication circuit to select a multiplication factor which is proportional to said shaft angular velocity, whereby the rate of change of the tuner frequency is affected.

9. A circuit as in claim 8 wherein said pulse counter has separate inputs for respectively incrementing and decrementing the quantity therein, and further comprising gating means for steering the multiplied repetition rate pulse train output of said multiplication circuit to a selected one of said pulse counter inputs, and means responsive to said shaft angular direction stream of pulses to cause said gating means to steer said multiplied pulse train to said incrementing input when said tuning control shaft is turned in one angular direction and to said decrementing input when said tuning control shaft is turned in the opposite angular direction.

10. A circuit as in claim 9 wherein said shaft angular direction stream of pulses is produced by said shaft encoder in a selected phase relation to said angular velocity pulse train signal, and further comprising means for detecting the sign of the phase relation between said two shaft encoder outputs whereby to determine the angular direction of said tuning control shaft, said detecting means being arranged to control said gating means whereby to increment or decrement said pulse counter according to said shaft direction.

* * * * *